US007125766B2

(12) United States Patent
Kim et al.

(10) Patent No.: US 7,125,766 B2
(45) Date of Patent: Oct. 24, 2006

(54) METHOD OF FORMING CAPACITOR FOR SEMICONDUCTOR DEVICE

(75) Inventors: Dong-Chan Kim, Seoul (KR); Chang-Jin Kang, Suwon-si (KR); Byeong-Yun Nam, Suwon-si (KR); Kyeong-Koo Chi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/062,546

(22) Filed: Feb. 23, 2005

(65) Prior Publication Data
US 2005/0245026 A1 Nov. 3, 2005

(30) Foreign Application Priority Data
Mar. 16, 2004 (KR) ............... 10-2004-0017504

(51) Int. Cl.
*H01L 21/8242* (2006.01)
(52) U.S. Cl. ............ 438/253; 438/254; 438/396
(58) Field of Classification Search ........... 438/253, 438/254, 396
See application file for complete search history.

(56) References Cited

U.S. PATENT DOCUMENTS 6,511,878 B1 * 1/2003 Matsumura ............ 438/241
6,583,056 B1 6/2003 Yu et al.
6,700,153 B1 * 3/2004 Oh et al. ............... 257/309
6,930,014 B1 * 8/2005 Kim et al. ............. 438/396
2003/0121132 A1 7/2003 Oh et al.

FOREIGN PATENT DOCUMENTS

| JP | 2001057413 | 2/2001 |
| KR | 1020010011167 A | 2/2001 |
| KR | 1020020070730 A | 9/2002 |
| KR | 1020040001960 A | 1/2004 |

* cited by examiner

*Primary Examiner*—Jack Chen
(74) *Attorney, Agent, or Firm*—Volentine Francos & Whitt, PLLC

(57) ABSTRACT

A method of forming a capacitor for a semiconductor device is disclosed. According to the method, a silicon germanium layer and an oxide layer are used as mold layers for forming a storage electrode. The oxide layer and the silicon germanium layer are anisotropically etched to form an opening and then the silicon germanium layer is further isotropically etched to form a recessed portion of the opening, such that the recessed portion of the opening formed in the silicon germanium layer is wider than at least some portion of the opening through the oxide layer. Thus, the mold layers are used to form a storage electrode having a lower portion which is wider than an upper portion thereof.

20 Claims, 19 Drawing Sheets

METHOD OF FORMING CAPACITOR FOR SEMICONDUCTOR DEVICE

BACKGROUND OF THE INVENTION

1. Field of the Invention

The present invention relates generally to a method of forming a capacitor for a semiconductor device, and more particularly to a method of forming a capacitor for a semiconductor device using a silicon germanium layer as a mold layer.

A claim of priority is made to Korean Patent Application No. 2004–17504 filed on Mar. 16, 2004, the disclosure of which is hereby incorporated by reference in its entirety.

2. Description of the Related Art

As semiconductor devices such as dynamic random access memory (DRAM) have become increasingly integrated, a significant amount of research has gone into developing chips with a certain amount of capacitance within an increasingly minute area. In particular, researchers have worked to create smaller and smaller memory cells having a predetermined capacitance.

From a theoretical view, three main classes of methods are known to increase the capacitance of a capacitor: (1) using a material with a high dielectric constant for a dielectric layer in the capacitor, (2) enlarging the effective area of the capacitor, and (3) reducing the distance between upper and lower electrodes of the capacitor.

The effective area of a capacitor can be increased by deforming the surfaces of the capacitor or by increasing the height of the capacitor's storage electrodes. However, due to the high cost associated with manufacturing capacitors with deformed or irregular surfaces, more research has focused on increasing the height of storage electrodes.

Recently, capacitors have been developed with storage electrode heights greater than about 2000 Å in order to obtain sufficient capacitance for small DRAM cells.

FIGS. 1A to 1E are cross-sectional views illustrating a conventional method of forming a capacitor for a semiconductor device.

Referring to FIG. 1A, a device isolation trench 12 is formed in a semiconductor substrate 10, thereby defining an active region in semiconductor substrate 10. An active device is formed on the active region, and a MOS transistor is used as an exemplary active device for purposes of illustration.

The MOS transistor comprises a gate electrode in which a polysilicon layer 16 and a tungsten silicide layer 18 are sequentially stacked on a gate oxide layer 14. A first sidewall spacer 20 and a first mask layer 22 protect the gate electrode during subsequent processing. Dopants are implanted in surface portions of the active region using the gate electrode as an implantation mask, thereby forming source/drain regions (not shown) in the active region.

A contact hole is then formed on the source/drain regions using a self-aligned contact (SAC) process. The contact hole is filled with a conductive material such as polysilicon to thereby form contact plugs 24 and 26. A chemical mechanical polishing (CMP) process is used to separate contact plugs 24 and 26 from each other, and thus each of contact plugs 24 and 26 is positioned and functions independently from the other.

A first insulation layer 28 is then formed on semiconductor substrate 10 to a thickness sufficient to cover contact plugs 24 and 26. First insulation layer 28 is planarized using a conventional CMP process.

A bit line contact hole is formed in first insulation layer 28 to expose contact plug 24 (a drain contact plug). The bit line contact hole is filled with a conductive material to thereby form a bit line 30. A second sidewall spacer 32 and a second mask layer 34 are formed to protect bit line 30.

A second insulation layer 36 is formed on semiconductor substrate 10 to a thickness sufficient to cover bit line 30, and a conventional CMP process is used to planarize a surface of second insulation layer 36.

An opening is formed in second insulation layer 36 using a photolithography process, and polysilicon is used to fill the opening, thereby forming a contact plug 37. A nitride layer is formed on second insulation layer 36 and contact plug 37 to form an etch stop layer 38. An oxide layer 40 functioning as a mold layer during the formation of a storage electrode is then formed on etch stop layer 38 to a thickness of at least about 20000 Å. Polysilicon is then deposited on oxide layer 40 to form a hard mask layer, and a photoresist layer is formed on the hard mask layer. The photoresist layer is patterned using a conventional photolithography process, and thus a photoresist pattern (not shown) is formed in such a manner that a desired capacitor area is defined. The hard mask layer is dry-etched using the photoresist pattern as an etching mask to form a hard mask pattern 42. The photoresist pattern is completely removed using an ashing and stripping process(es).

Referring to FIG. 1B, oxide layer 40 and etch stop layer 38 are anisotropically etched by an etching process using hard mask pattern 42 an etching mask to form an opening 44 through which a top surface of contact plug 37 is exposed.

An upper portion 44a of opening 44 is larger than a lower portion 44b of opening 44, and hence a critical dimension (CD) associated with the bottom portion of opening 44 is smaller than a CD associated with the top portion of opening 44. This result occurs because the etch rate is reduced as the etching process advances due to a loading effect, thereby causing the etch rate applied to the lower portion 44b to be less than that applied to the upper portion 44a. In other words, the resulting sidewalls of opening 44 lean somewhat outward, and thus as opening 44 descends, the difference between the CD of the bottom and top portions of opening 44 becomes greater. That is, the difference between the CD of the bottom and top portions of opening 44 increases as the height of the to-be-formed storage electrode increases.

After opening 44 is formed, a polysilicon layer 46 is formed to a uniform thickness on hard mask pattern 42 and sidewalls of opening 44 as shown in FIG 1C.

Referring to FIG. 1D, a sacrificial insulation layer (not shown) is formed on polysilicon layer 46 to a thickness sufficient to fill opening 44. Portions of sacrificial insulation layer 48 and polysilicon layer 46 are then selectively removed and planarized until a top surface of an etched oxide layer 40a is exposed, leaving only a portion of sacrificial insulation layer in opening 44 to form a sacrificial insulation pattern 48. Accordingly, capacitor nodes associated with different transistor cells are separated from each other.

Referring to FIG. 1E, etched oxide layer 40a and sacrificial insulation pattern 48 are removed by a wet etching process. At this point, a storage electrode 46a is complete. Of note, a top portion of storage electrode 46a having width "A" is larger than a width "B" associated with a bottom portion of storage electrode 46a.

A dielectric layer (not shown) and a plate electrode (not shown) are then formed to cover storage electrode 46a, thereby completing a capacitor for a semiconductor device such as a DRAM.

Unfortunately, the foregoing, conventional method of forming a capacitor has a number of problems—some of which will be described in the following paragraphs.

First, after opening 44 is formed using hard mask pattern 42 as an etching mask, an inspection process is often performed using a scan electron microscope (SEM) to detect whether or not opening 44 is sufficiently opened. However, if hard mask pattern 42 were left in place, this inspection process would be obstructed, and thus hard mask pattern 42 must be removed prior to inspection of the opening 44. This requirement adds an additional process step to the method used to form the capacitor.

Second, the CMP process used to obtain node separation is expensive, and yet it cannot be replaced with a less expensive dry etching process, such as an etch-back process, for a number of reasons. In general, hard mask pattern 42 has various sizes, and where the dry etching process is performed, an etch rate is greater for a larger pattern than for a smaller pattern. Accordingly, where hard mask pattern 42 is relatively large, it is commonly over-etched, thereby partially removing an upper portion "C" of polysilicon layer 46, (see FIG. 1D), and hence reducing the size of storage electrode 46a. Therefore, the CMP process cannot be replaced in the conventional method with an etch-back process to obtain node separation. As a result, the manufacturing process for the capacitor can be prohibitively expensive.

Third, where a wet etching process is performed to remove sacrificial insulation layer 48 and etched oxide layer 40a following node separation, an etchant used in the wet etching process may infiltrate a boundary surface "D" (see FIG. 1E) between storage electrode 46a and etch stop pattern 38a. Because of this, second insulation layer 36 is also etched away by the infiltrated etchant and storage electrode 46a typically brakes.

Fourth, storage electrode 46a has a top portion with a width "A" and a bottom portion with a narrower width "B" (see FIG. 1E) due to a loading effect occurring in the etching process used to form opening 44. In other words, storage electrode 46a has a shape similar to an inverted triangle, which makes it structurally unsound. Accordingly, where the cell area is reduced and the storage electrode of the capacitor becomes very high, storage electrode 46a is easily broken by its own weight and awkward structure. In addition, when a wafer including storage electrode 46a is transferred for subsequent processing, even the slightest external impact may brake the electrode. Where storage electrode 46a is broken, it often makes contact with an adjacent storage electrode thereby generating a 2-bit (or 2-cell) failure in the context of a DRAM device.

Various studies have been conducted in attempts to effectively address the above problems. For example, U.S. Pat. No. 6,583,056 ('056) discloses a storage electrode including a double layer as a mold layer. The mold layer disclosed in '056 includes a lower mold layer into which impurities are implanted and an upper mold layer into which impurities are not implanted. The storage electrode disclosed in '056 is formed to have a stable shape by using upper and lower layers having different etch rates.

However, the storage electrode of '056 has a number of problems. For example, impurities are non-uniformly distributed on the mold layer in spite of the provision for heat treatment, and therefore the opening typically has ajar shape due to the non-uniform distribution of the impurities. In addition, the impurities tend to migrate into a contact plug during the heat treatment, thereby altering electrical resistance of the contact plug. In addition, the implanted impurities deteriorate characteristics of the active device (e.g. a transistor), causing such problems as the short channel effect.

Korean Publication Patent No. 2001-11167 ('167) discloses a single cylinder stacked capacitor including a double layer as a mold layer. The mold layer in '167 includes a lower mold layer comprising boron phosphorus silicate glass (BPSG) and an upper mold layer comprising plasma-enhanced tetraethylorthosilicate (PETEOS). The single cylinder stacked capacitor in '167 is formed to have a stable shape using upper and lower layers having different etch rates.

However, the storage electrode of '167 also has various problems as follows. The etch selectivity of the BPSG layer is about 2:1 relative to the PETEOS layer, and therefore an increase in the CD of a bottom of an opening requires an increase in the CD of a top of the opening. Accordingly, adjacent storage electrodes tend to be very close to each other and as a result they often generate 2-bit failures with even slight external impact.

In addition, where the concentration of the boron or phosphorus is increased in order to improve an etch rate of the BPSG layer, an etching polymer is likely to be formed during a dry-etching process, and thus the opening is generally not large enough, which is a well known phenomenon called a "not-open" failure.

In order to overcome at least the failings of the conventional methods described above, what is needed is a new method of forming a capacitor for a semiconductor device.

SUMMARY OF THE INVENTION

The present invention provides a method of forming a capacitor using a silicon germanium layer as a mold layer in order to improve the stability of the capacitor by modifying its shape.

According to one embodiment of the present invention, a method of forming a capacitor for a semiconductor device is provided. According to the method, an insulation layer is formed on a substrate. The insulation layer has a contact plug formed therein. A silicon germanium layer is formed on the insulation layer, and an oxide layer is formed on the silicon germanium layer. An anisotropic etching process is performed on the oxide layer and the silicon germanium layer to form an opening through which a top surface of the contact plug is exposed. An isotropic etching process is performed on the silicon germanium layer exposed in the opening to form recesses therein such that a lower portion of the opening corresponding to the silicon germanium layer is wider than at least part of an upper portion in the opening corresponding to the oxide layer. A storage electrode is formed on the contact plug in conformity with inner contours of the opening. A dielectric layer and a plate electrode are formed to cover the storage electrode.

According to another embodiment of the present invention, another method of forming a capacitor for a semiconductor device is provided. An insulation layer is formed on a substrate, the insulating layer having a contact plug formed therein. A silicon germanium layer is formed on the insulation layer, and an oxide layer is formed on the silicon germanium layer. A hard mask layer is formed on the oxide layer, and the hard mask layer is partially etched to form a hard mask pattern. A first anisotropic etching process is performed on the oxide layer using the hard mask pattern as an etching mask, thereby forming a first opening in the oxide layer through which a top surface of the silicon germanium layer is partially exposed. A second anisotropic etching process is performed on the exposed silicon germanium layer, thereby forming a second opening through which a top surface of the contact plug is exposed. An isotropic etching process is performed on the silicon germanium layer exposed in the second opening to form recesses in sidewalls of the silicon germanium layer in the second opening such that the second opening is wider than at least part of the first opening. A storage electrode is formed on the contact plug in conformity with inner contours of the first and second openings. A dielectric layer and a plate electrode are sequentially formed to cover the storage electrode.

BRIEF DESCRIPTION OF THE DRAWINGS

The invention is described below in relation to several embodiments illustrated in the accompanying drawings. Throughout the drawings the thickness of layers has been exaggerated for clarity and like reference numbers indicate like exemplary elements, components, or steps. In the drawings.

DESCRIPTION OF THE EXEMPLARY EMBODIMENTS

The present invention now will be described more fully with reference to the accompanying drawings in which exemplary embodiments of the present invention are shown.

FIGS. 2A to 2G are cross sectional views illustrating a method of forming a capacitor for a semiconductor device according to one embodiment of the present invention.

Figure 1A:
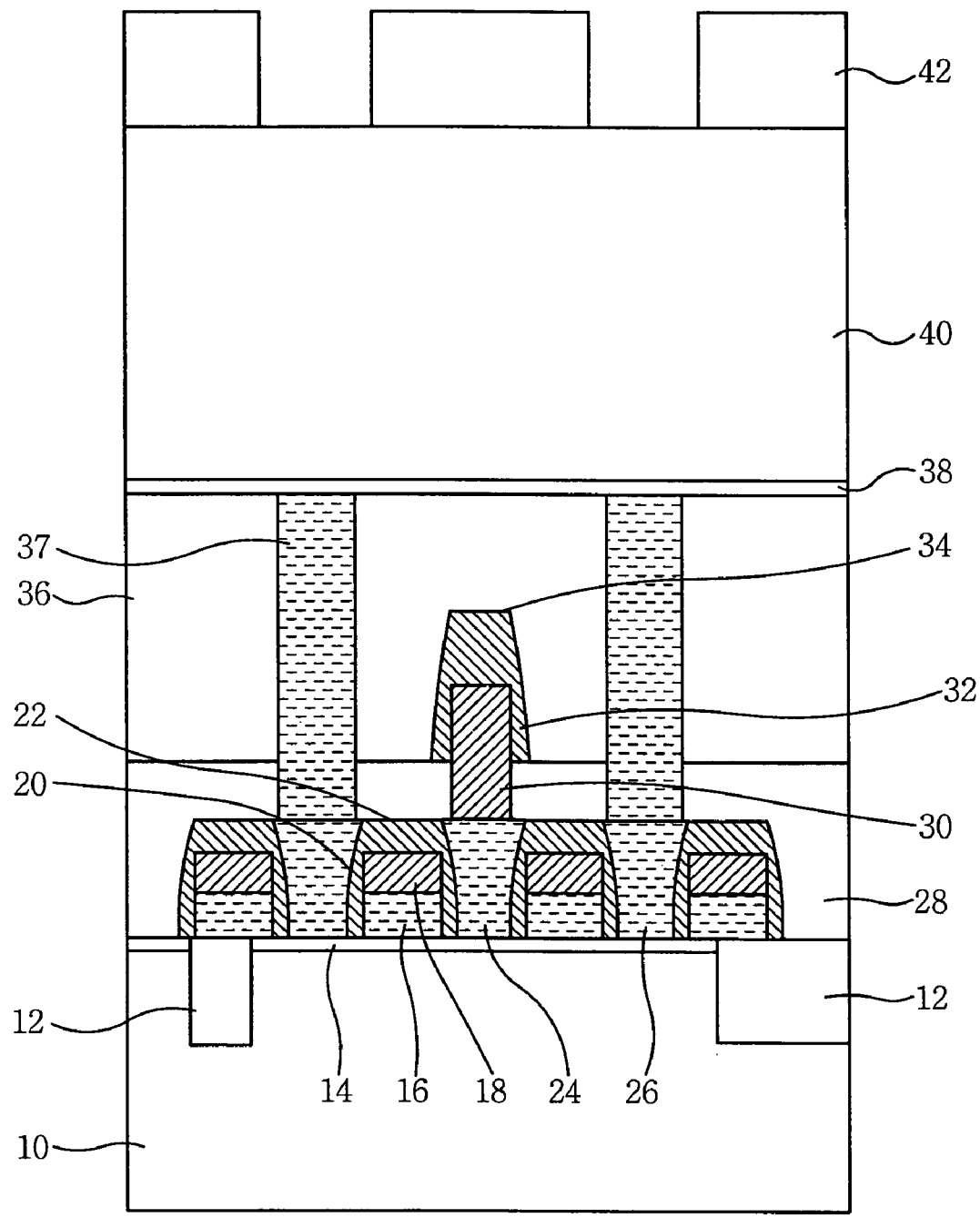
FIGS. 1A to 1E are cross-sectional views illustrating a conventional method of forming a capacitor for a semiconductor device.
Figure 1B:
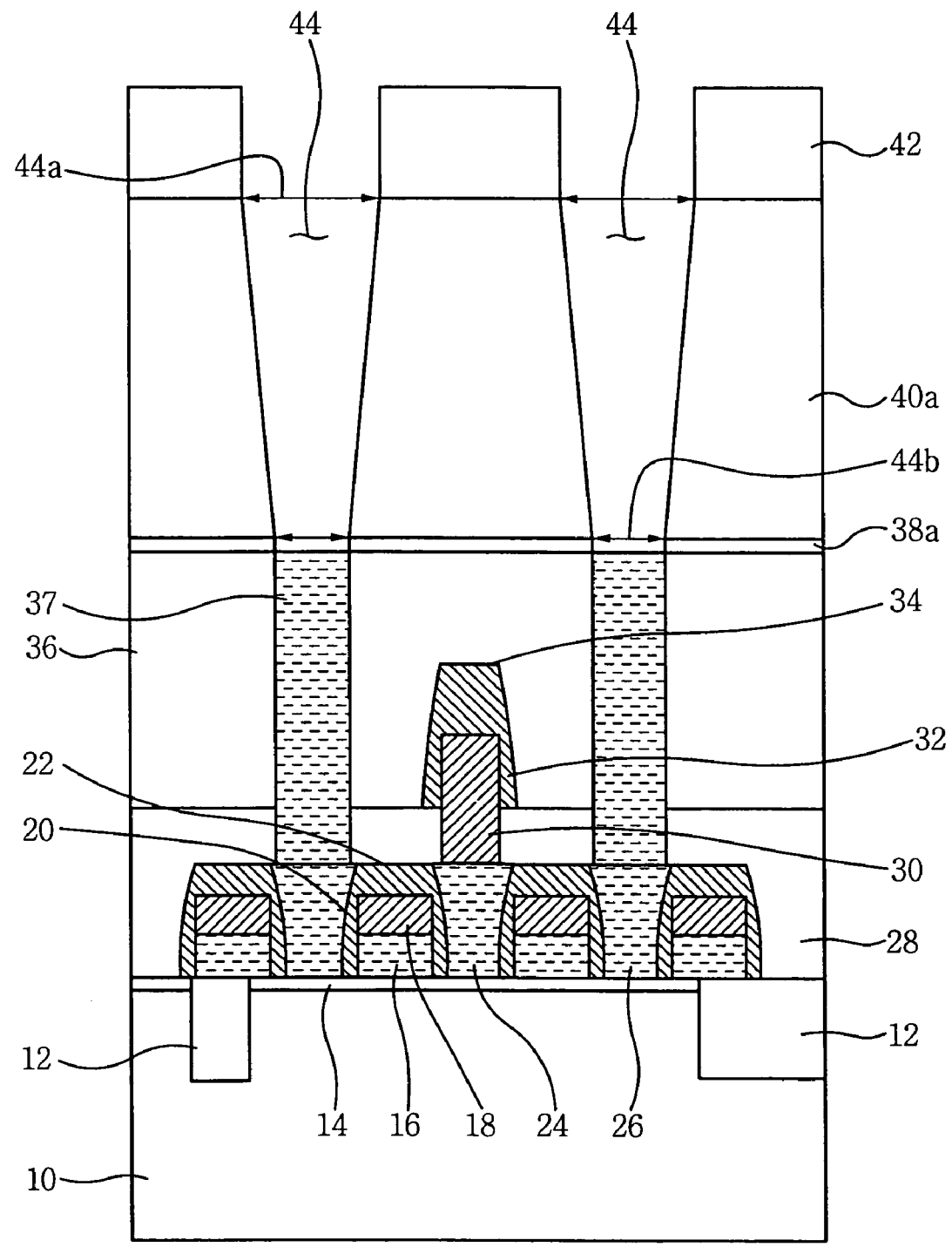
Figure 1C:
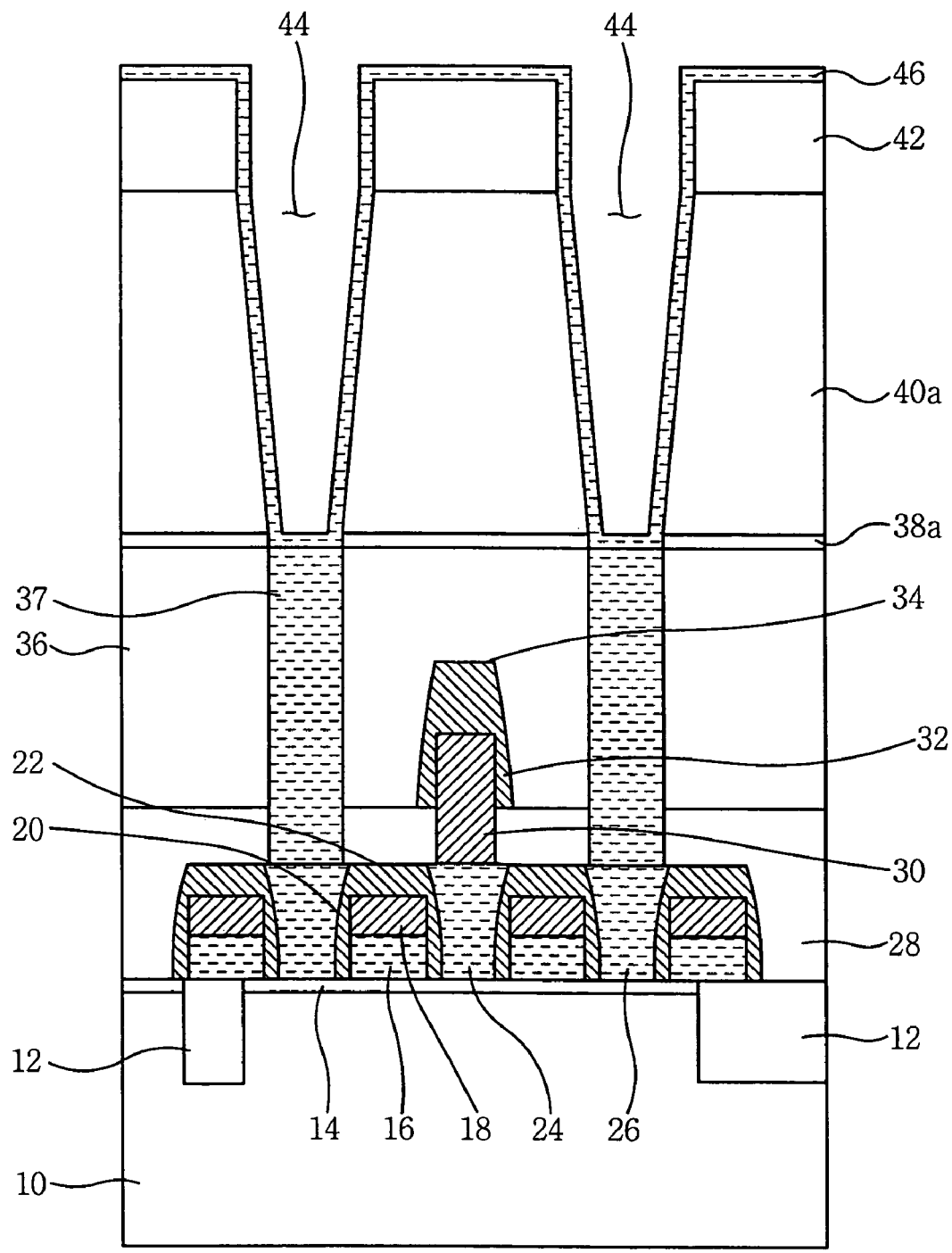
Figure 1D:
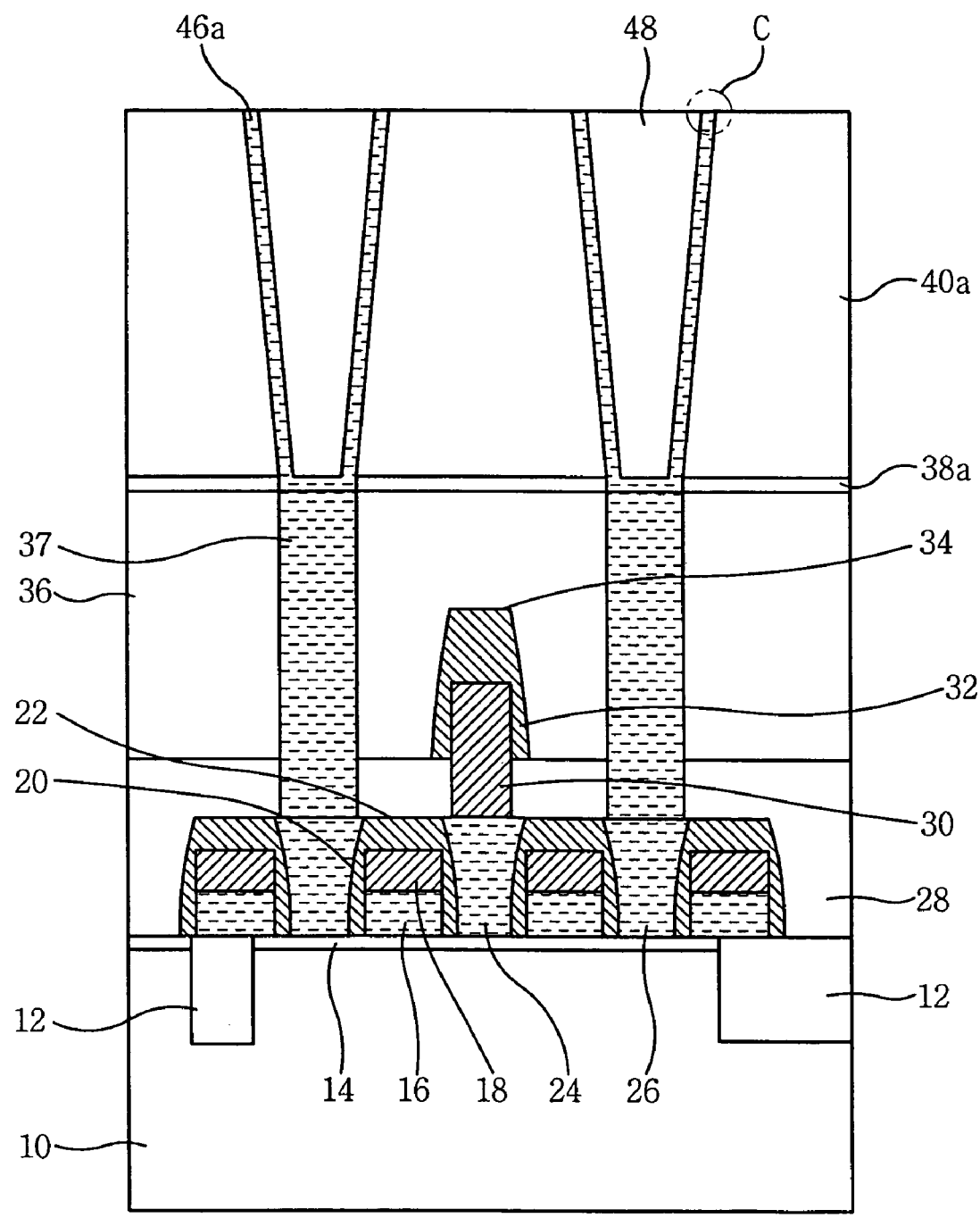
Figure 1E:
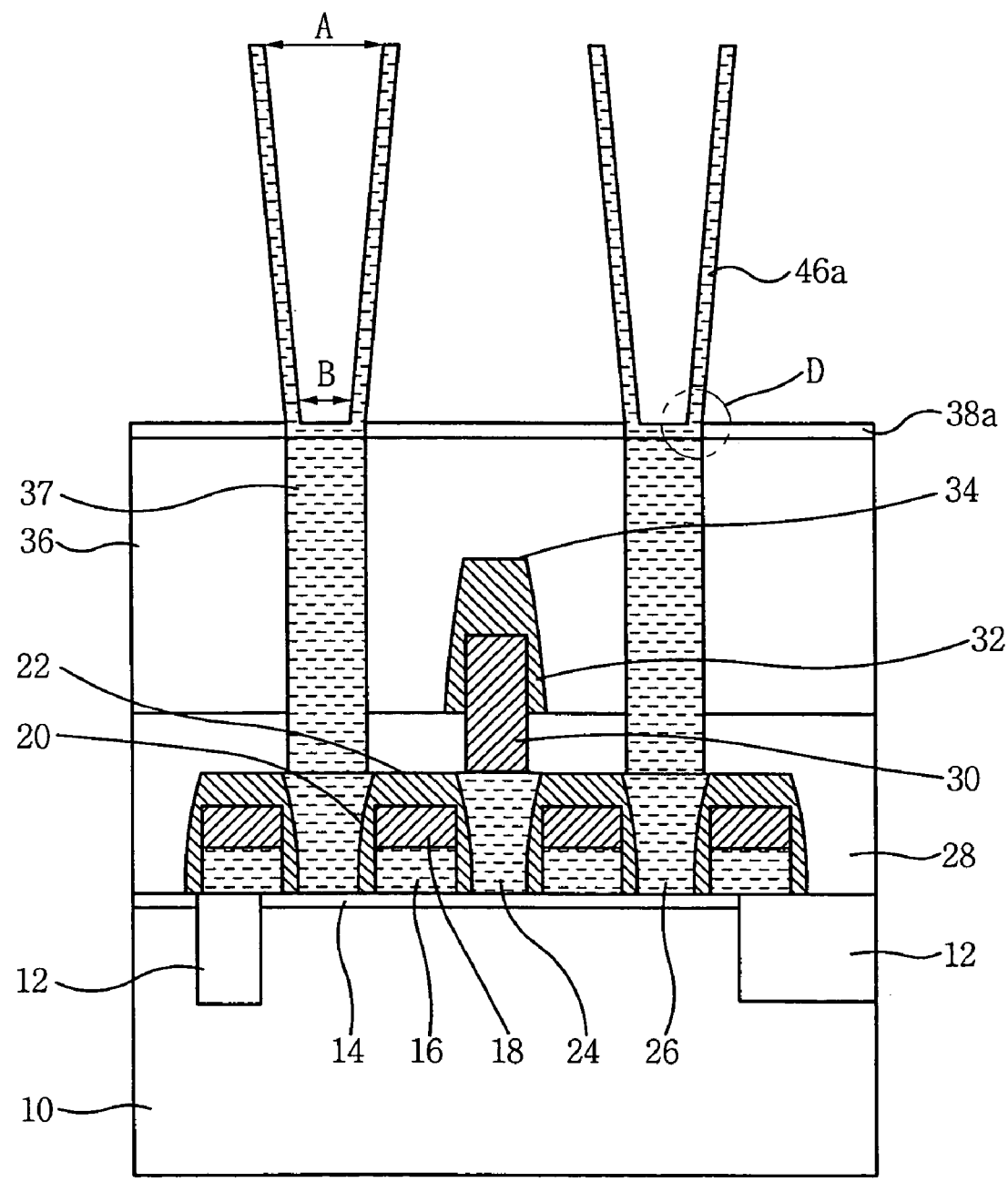
Figure 2A:
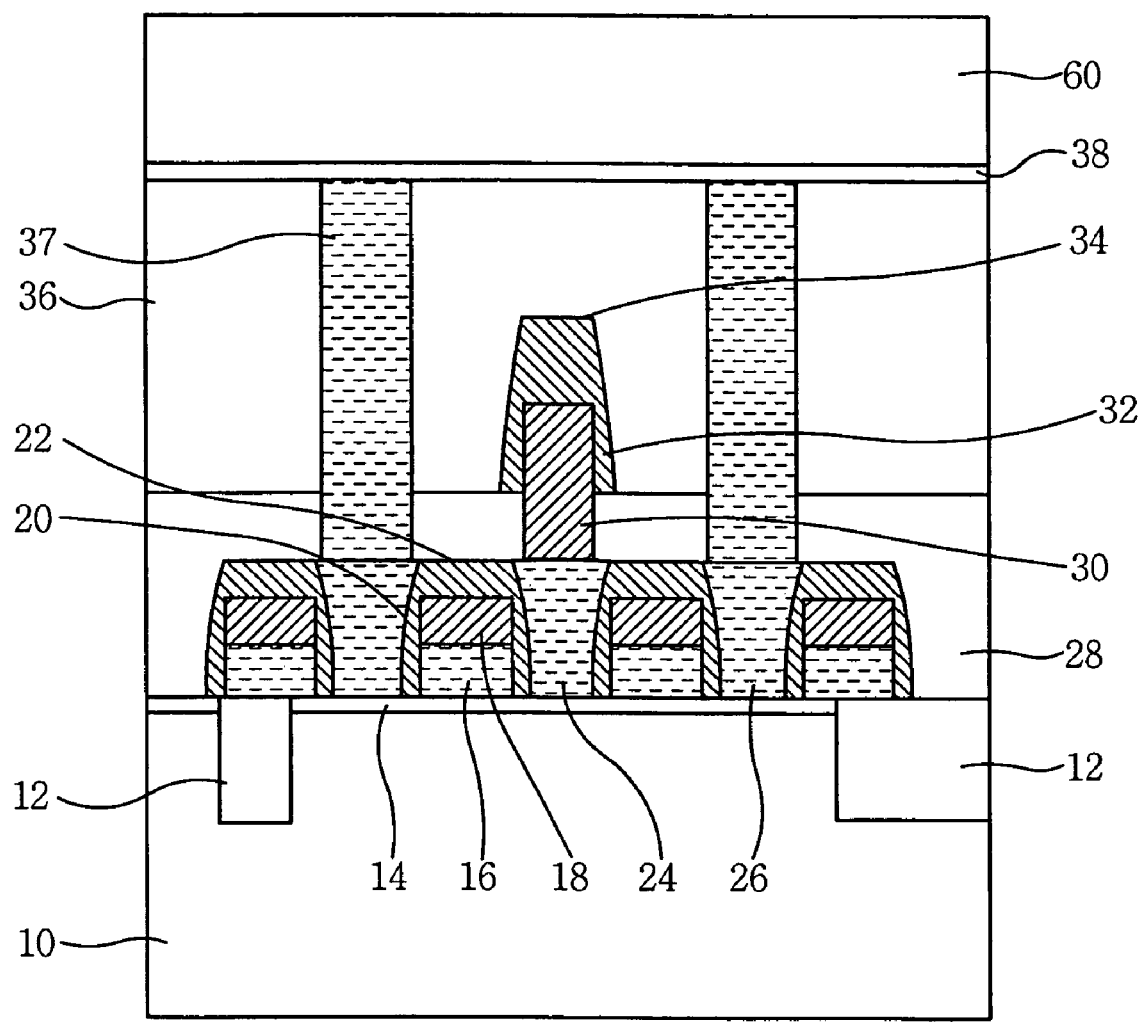
FIGS. 2A to 2G are cross-sectional views illustrating a method of forming a capacitor for a semiconductor device according to one embodiment of the present invention; and, FIGS. 3A to 3G are cross-sectional views illustrating a method of forming a capacitor for a semiconductor device according to another embodiment of the present invention.

Referring to FIG. 2A, an etch stop layer 38 is formed on a substrate 10 upon which a transistor cell, bit line and contact plug have previously been formed. A silicon germanium layer 60 functioning as a lower mold layer is formed to thickness ranging from about 3000 Å to about 10000 Å on etch stop layer 38.

Figure 2B:
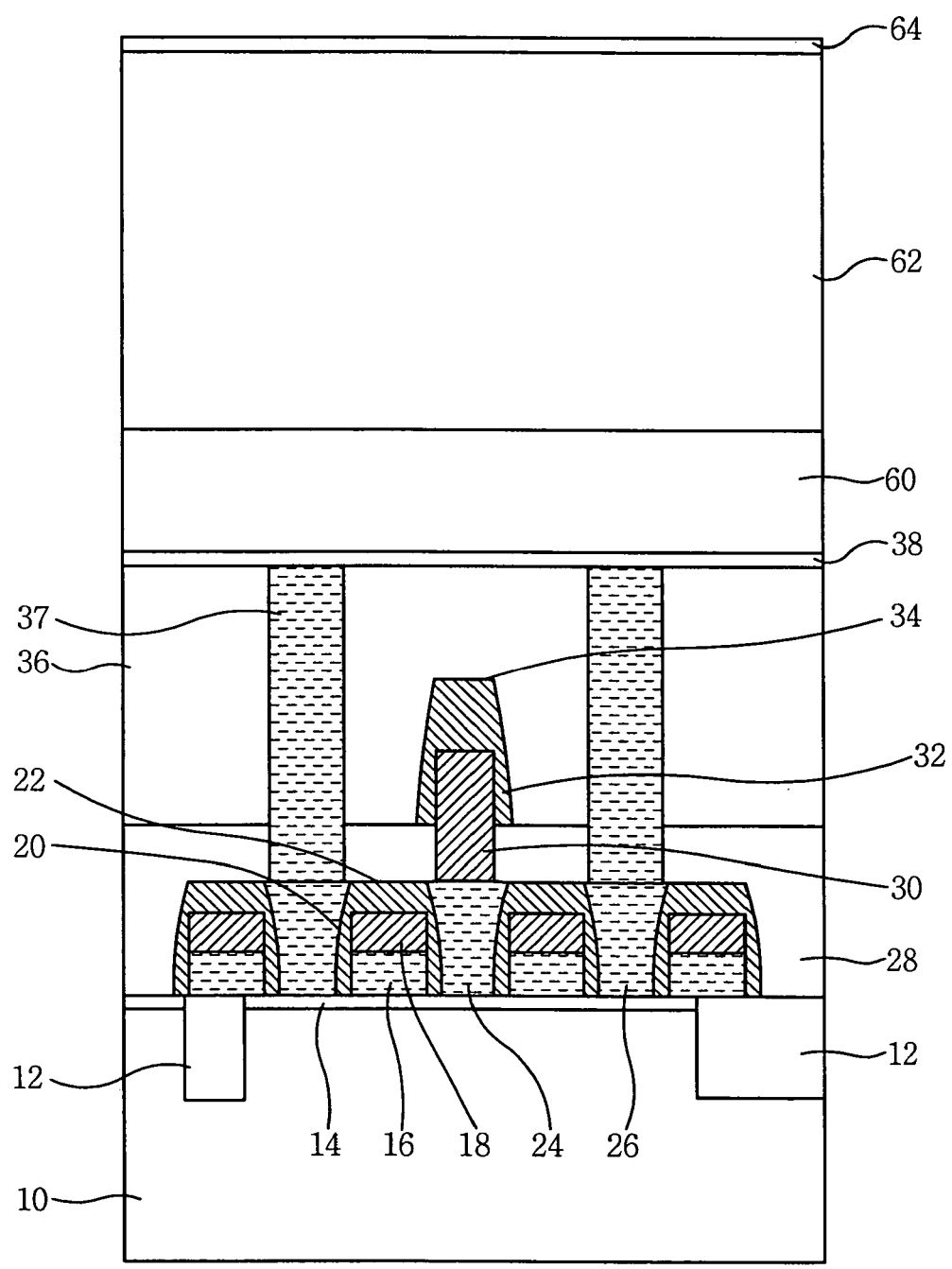

Referring to FIG. 2B, an oxide layer 62 comprising PETEOS and functioning as an upper mold layer is formed on silicon germanium layer 60 to a predetermined thickness in view of the anticipated height of the capacitor. An anti-reflection layer 64 is formed on oxide layer 62.

Figure 2C:
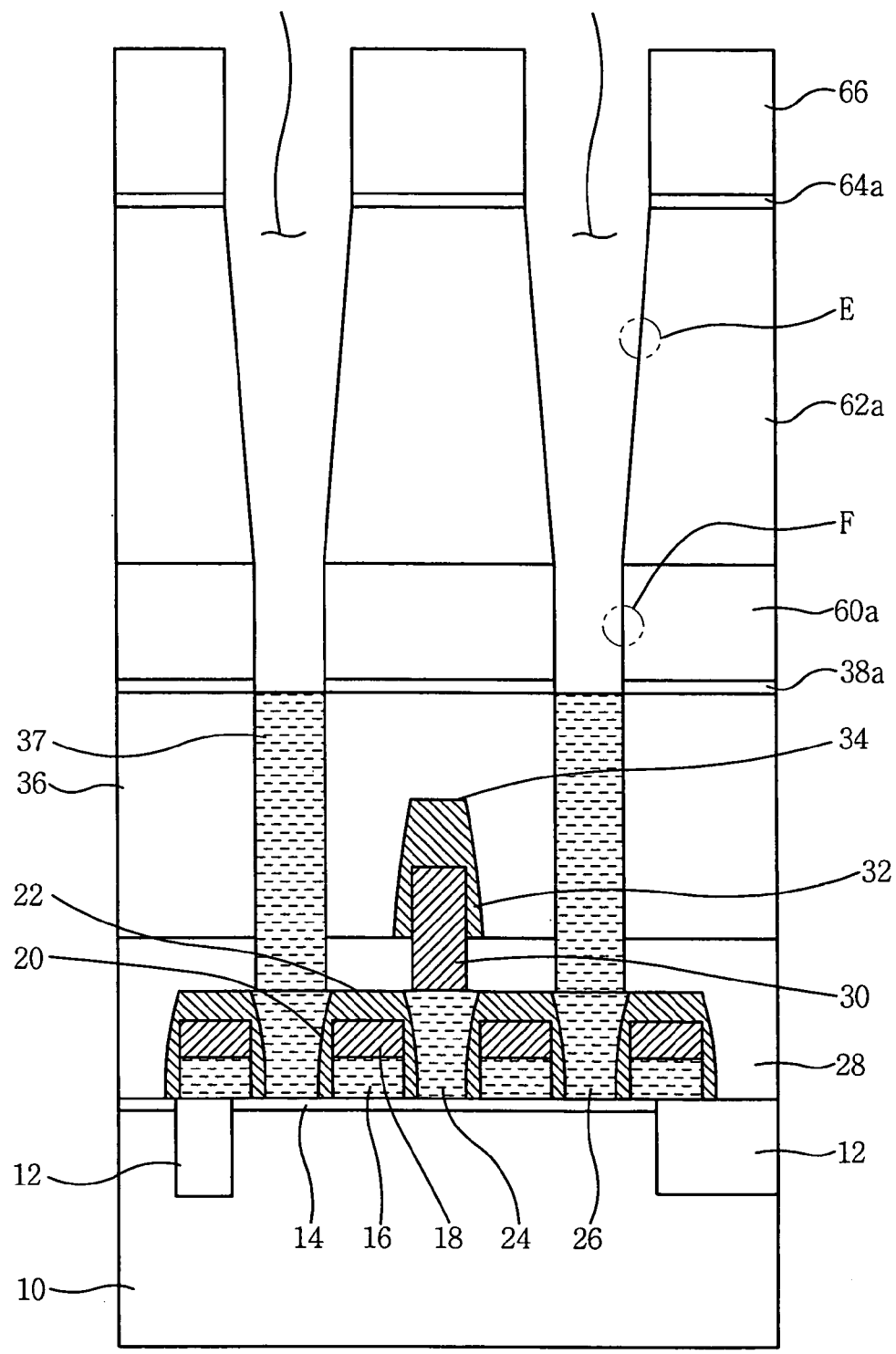

Referring to FIG. 2C, a photoresist layer is formed on anti-reflection layer 64 and a conventional photolithography is then used to form a photoresist pattern 66 defining a capacitor area. Anti-reflection layer 64, oxide layer 62, silicon germanium layer 60, and etch stop layer 38 are then selectively removed using an anisotropic etching process in order to form an opening 68, whereby a top surface of contact plug 37 is exposed. A resulting etched anti-reflection layer 64a, etched oxide layer 62a, etched silicon germanium layer 60a, and etched etch stop layer 38a are produced by the anisotropic etching process.

The upper sidewalls "E" of opening 68 is somewhat inclined through etched oxide layer 62a, such that the width of opening 68 is reduced as it descends through etched oxide layer 62a. In contrast, the lower sidewalls "F" of opening 68 descend substantially in parallel and are substantially perpendicular to the top surface of contact plug 37, such that the width of opening 68 remains relatively constant through etched silicon germanium layer 60a. This result occurs because lower sidewalls "F" of opening 68 are formed by etching silicon germanium in a vertical direction relative to the substrate using a dry-etching process, thereby avoiding the loading effect otherwise impairing the etching process.

Figure 2D:
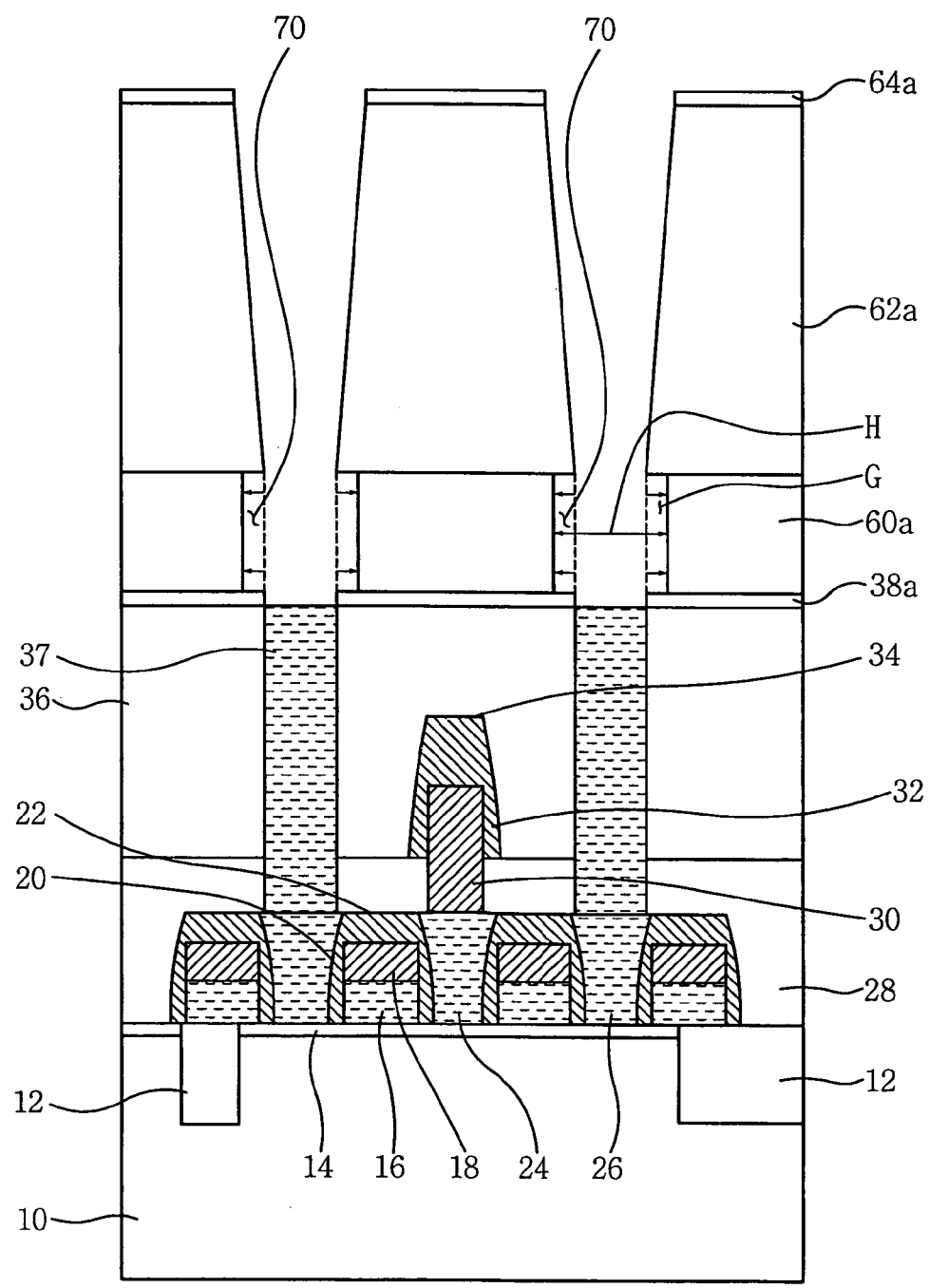

Referring now to FIG. 2D, after photoresist pattern 66 is removed using an ashing and stripping processes, an SEM inspection process may be performed to detect whether or not opening 68 is sufficiently opened. An isotropic etching process may be performed on opening 68 using a mixture of ammonium hydroxide ($NH_4OH$), hydrogen peroxide ($H_2O_2$), and de-ionized water ($H_2O$) as an etchant. The mixture of $NH_4OH$, $H_2O_2$, and $H_2O$ is widely known as SC1.

According to one embodiment, etched silicon germanium layer 60a has an etch selectivity of about 250:1 with respect to etched oxide layer 62a in relation to the above etchant, so that etched oxide layer 62a is not significantly further etched during the isotropic etching process. However, etched silicon germanium layer 60a is further etched during the isotropic etching process in a horizontal (lateral) direction substantially parallel with the top surface of contact plug 37. Accordingly, a recessed opening 70 is formed under etched oxide layer 62a in a lower portion of opening 68. Hence, opening 68 is extended laterally by recessed opening 70. Recessed opening 70 extends laterally in both horizontal direction with respect to opening 68 by a distance "G" to form an expanded opening having a width "H" which is larger than the width formerly associated with the lower portion of opening 68. The values "G" and "H" are determined by an amount of etched silicon germanium layer 60a removed during the isotropic etching process.

Table 1 contains experimental data illustrating how the etch rate of the etchant used in the isotropic etching process varies according to the percentage of germanium contained in the silicon germanium layer.

TABLE 1

| Percent germanium (%) | 18 | 37 | 50 |
|---|---|---|---|
| Etch rate (Å/min) | 14 | 87 | 126 |

The experimental data shown in Table 1 was obtained using the following experiment. A plurality of silicon germanium layers, each containing a different percentage of germanium, was formed on different wafers. The thickness of each of the silicon germanium layers was measured and then an etching process was performed on each of the wafers for one minute using an etchant including ammonium hydroxide ($NH_4OH$), hydrogen peroxide ($H_2O_2$), and de-ionized water. The thickness of each silicon germanium layer remaining on the respective wafers was measured after the etching process was performed, and the difference between the thickness of each wafer before and after the etching process was calculated in order to compute a corresponding etch rate.

As may be seen in Table 1, the etch rate of a silicon germanium layer varies according to the percentage of germanium in the silicon germanium layer. Accordingly, the amount of the silicon germanium layer removed by an etching process may be controlled by varying the percentage of germanium in the silicon germanium layer. In addition, the amount of the silicon germanium layer removed by the etching process may be controlled by varying the duration or etching time of the etching process. Accordingly, the width of recessed opening 70 may be determined by controlling the etching time and the percentage of germanium in the silicon germanium layer.

Figure 2E:
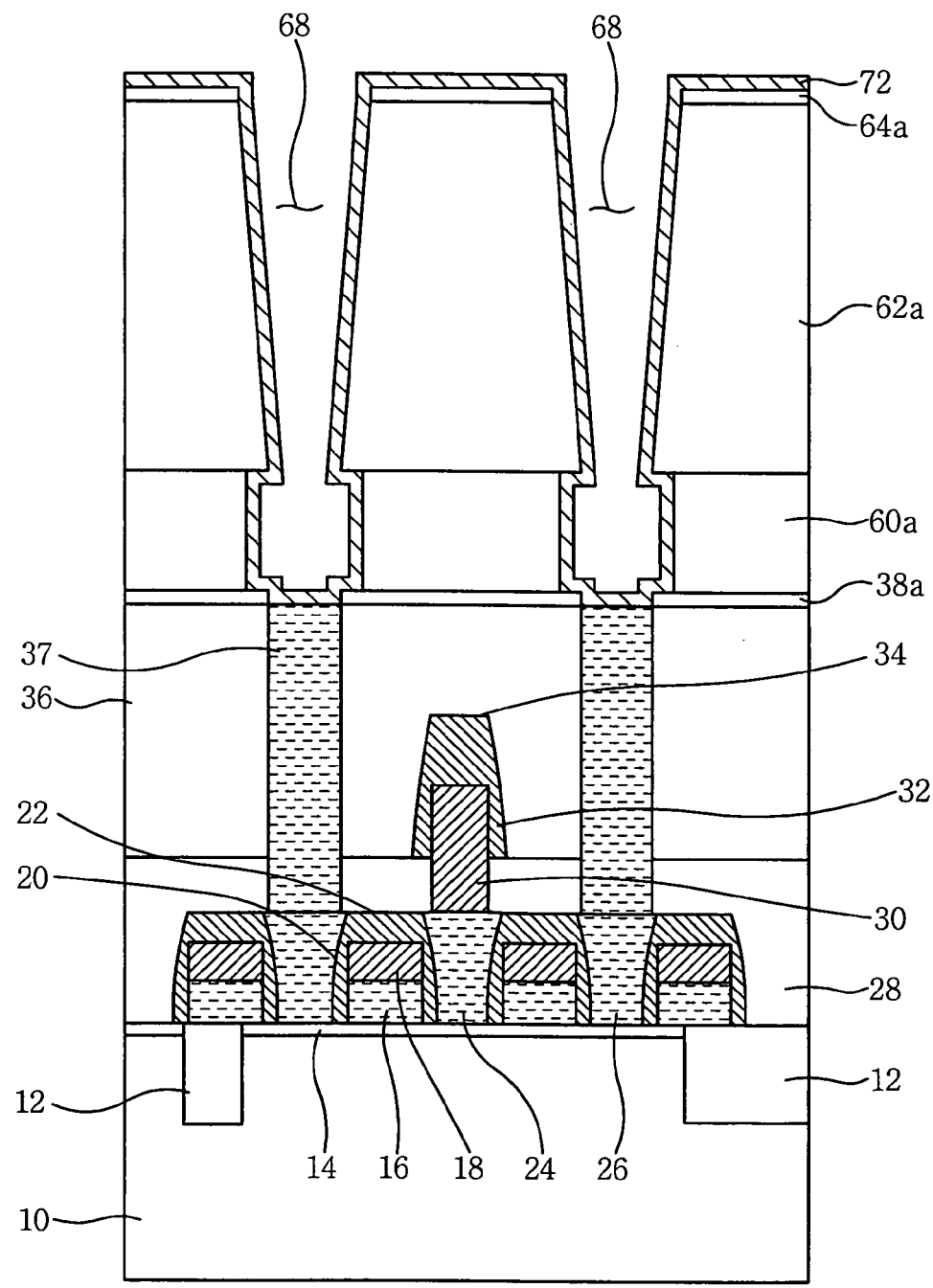

Referring to FIG. 2E, a polysilicon layer 72 is formed with a uniform thickness on inner surfaces of opening 68, including recessed portion 70, and on a top surface of etched anti-reflection layer 64a using a chemical vapor deposition (CVD) process. Polysilicon layer 72 will eventually become a storage electrode for the desired capacitor following subsequent processing.

Figure 2F:
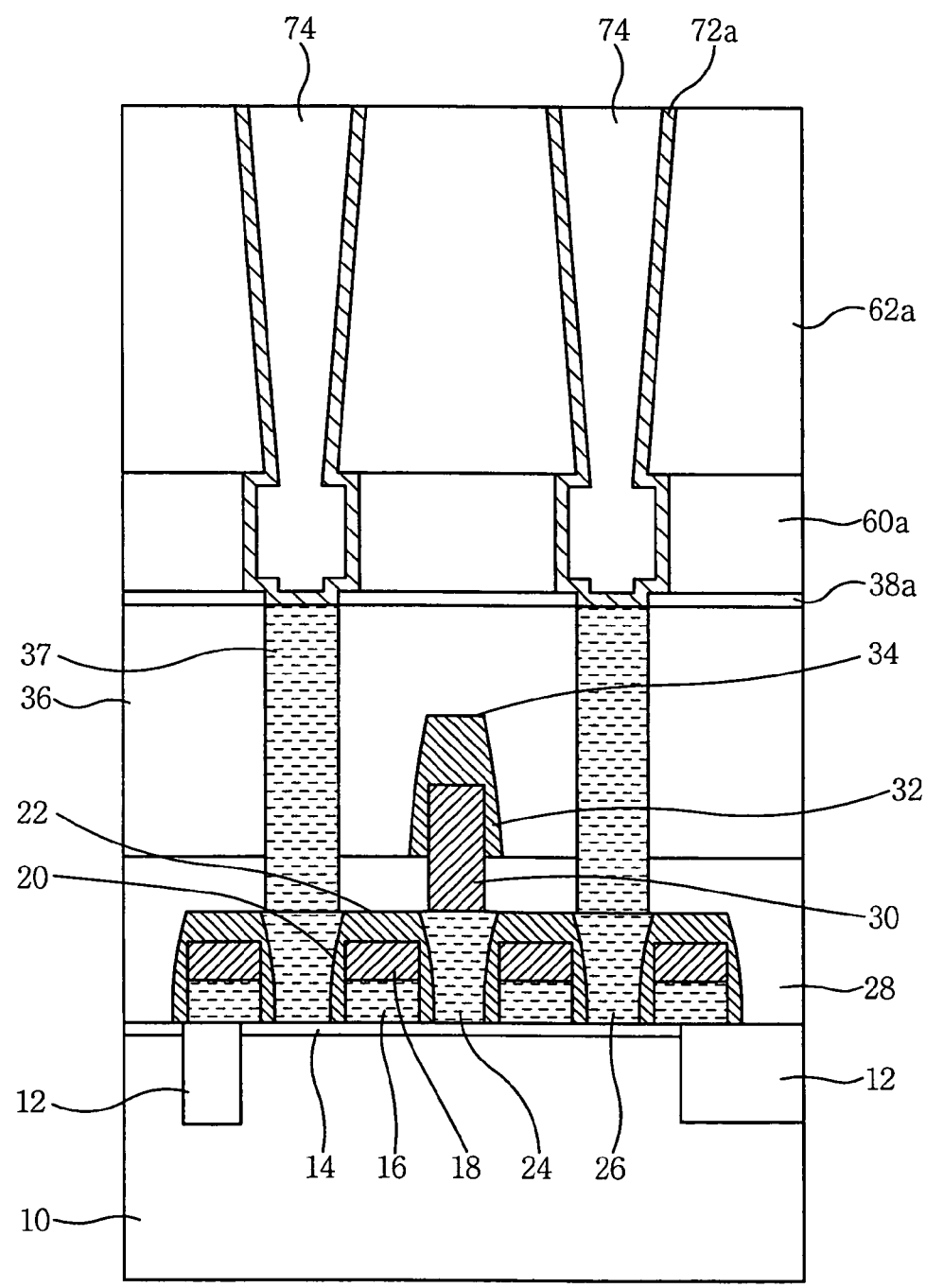

Referring to FIG. 2F, a sacrificial insulation layer (not shown) filling opening 68 and recessed opening 70 is formed on polysilicon layer 72. Portions of the sacrificial insulation layer and polysilicon layer 72 as well as etched anti-reflection layer 64a are removed and planarized using an etch-back process until a top surface of etched oxide layer 62a is exposed. As a result, a sacrificial insulation pattern 74 and a polysilicon pattern 72a are formed in openings 68 and 70. Accordingly, capacitor nodes associated with different transistor cells are separated from each other.

Figure 2G:
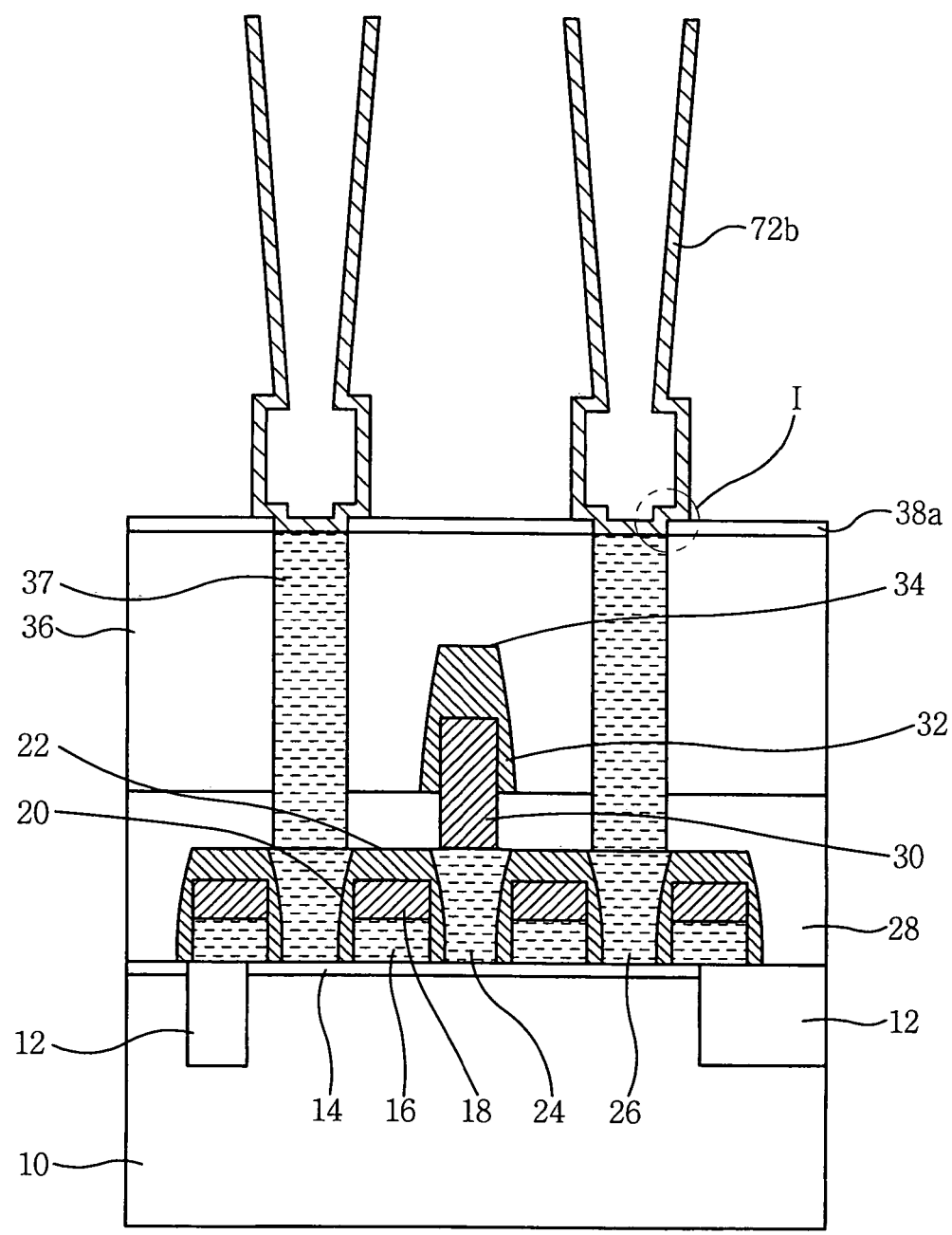

Referring to FIG. 2G, sacrificial insulation pattern 74, etched oxide layer 62a and etched silicon germanium layer 60a are removed from above etched etch stop layer 38a, so that only polysilicon pattern 72a remains on contact plug 37. The remaining polysilicon pattern 72a functions as a storage electrode 72b for the capacitor.

Processes used to remove sacrificial insulation pattern 74, etched oxide layer 62a and etched silicon germanium layer 60a from etched etch stop layer 38a will now be described in some additional detail. Etched oxide layer 62a and sacrificial insulation pattern 74 may be removed using a mixed solution including ammonium hydrogen fluoride ($NH_4HF_2$) and ammonium fluoride ($NH_4F$) (made by Stellachemifer Co. Ltd. as a commercially available limulus amebocyte lysate (LAL)). Etched silicon germanium layer 60a may be removed using a mixture of ammonium hydroxide ($NH_4OH$), hydrogen peroxide ($H_2O_2$) and de-ionized water as an etchant. Accordingly, storage electrode 72b is formed on the top surface of contact plug 37 and is in conformity with an inner contour of an opening in etched etch stop layer 38a.

Accordingly, storage electrode 72b is formed to have a lower portion which is wider than at least some part of an upper portion thereof in order to give it greater relative geometric stability. Because of its geometric stability, storage electrode 72b is less susceptible to being broken, and therefore the reliability of the semiconductor device including the capacitor is increased. In addition, the larger size of the lower portion of storage electrode 72b increases the effective surface area of storage electrode 72b, thereby increasing the overall capacitance of the semiconductor device containing the storage electrode.

The etchant is prevented from infiltrating the boundary surface between storage electrode 72b and etch stop layer 38a because the contact area between storage electrode 72b and etch stop layer 38a is relatively large compared with a conventional contact area. (See, element "I" in FIG. 2G). As a result, second insulation layer 36 is prevented from being etched by the etchant and therefore it provides sturdier support for storage electrode 72b. Hence, storage electrode 72b enjoys further mechanical resiliency as compared to the conventional structure.

Finally, a dielectric layer (not shown) and a plate electrode (not shown) are formed to cover storage electrode 72b, thereby completing a capacitor for a semiconductor device.

FIGS. 3A through 3G are cross-sectional views illustrating a method of forming a capacitor for a semiconductor device according to another embodiment of the present invention.

Figure 3A:
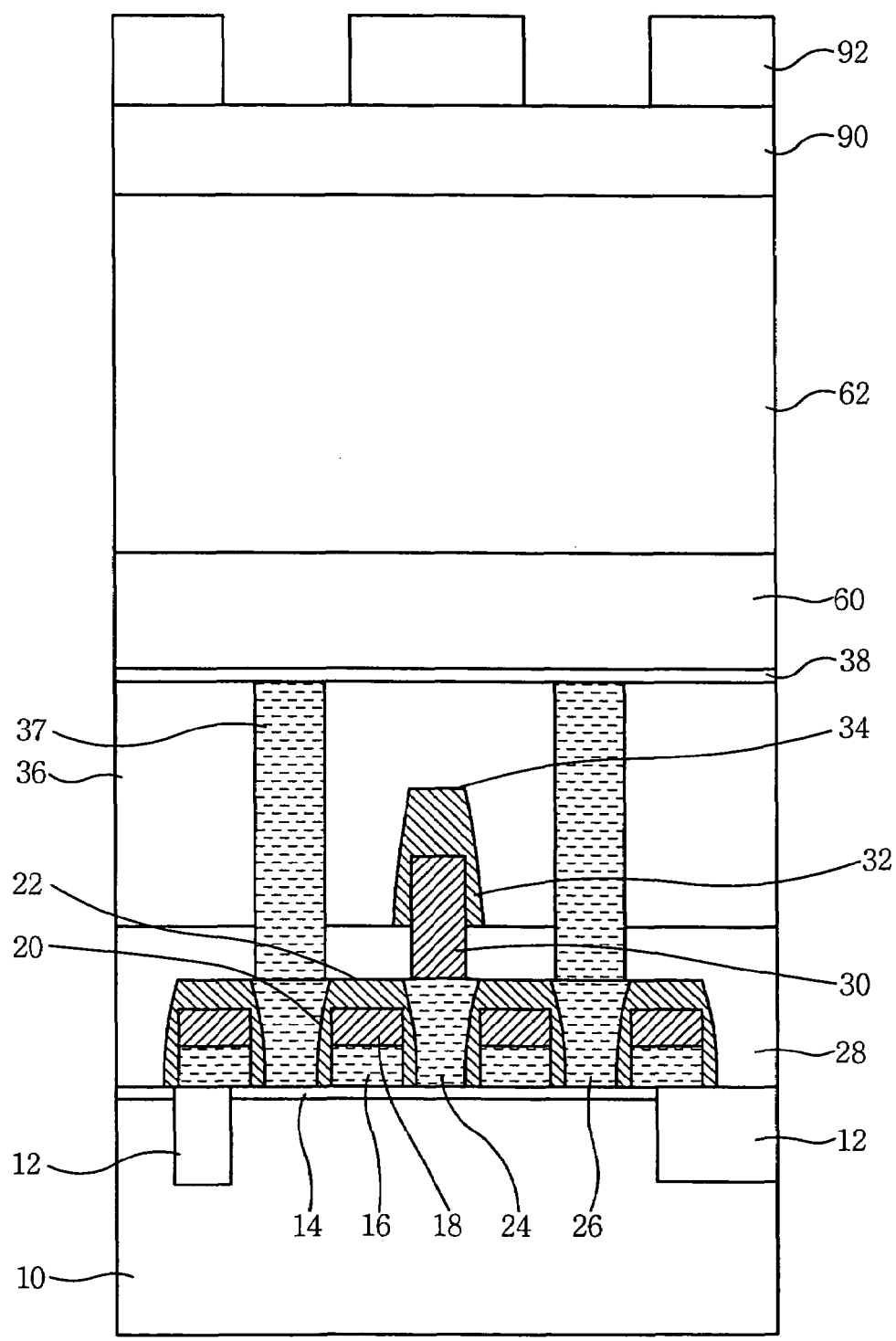

Referring to FIG. 3A, an etch stop layer 38 is formed on a substrate such as a silicon wafer including a transistor cell, a bit line and a contact plug. A silicon germanium layer 60 functioning as a lower mold layer is formed to a thickness of about 3,000 Å to 10,000 Å on etch stop layer 38.

An oxide layer 62 comprising PETEOS and functioning as an upper mold layer is formed to a predetermined thickness on silicon germanium layer 60 in view of a capacitor height.

A hard mask layer 90 comprising polysilicon is formed on oxide layer 62 to a thickness of about 3000 Å, and a photoresist layer (not shown) is formed on hard mask layer 90. A conventional photolithography process is performed on the photoresist layer to form a photoresist pattern 92 defining a capacitor area.

Figure 3B:
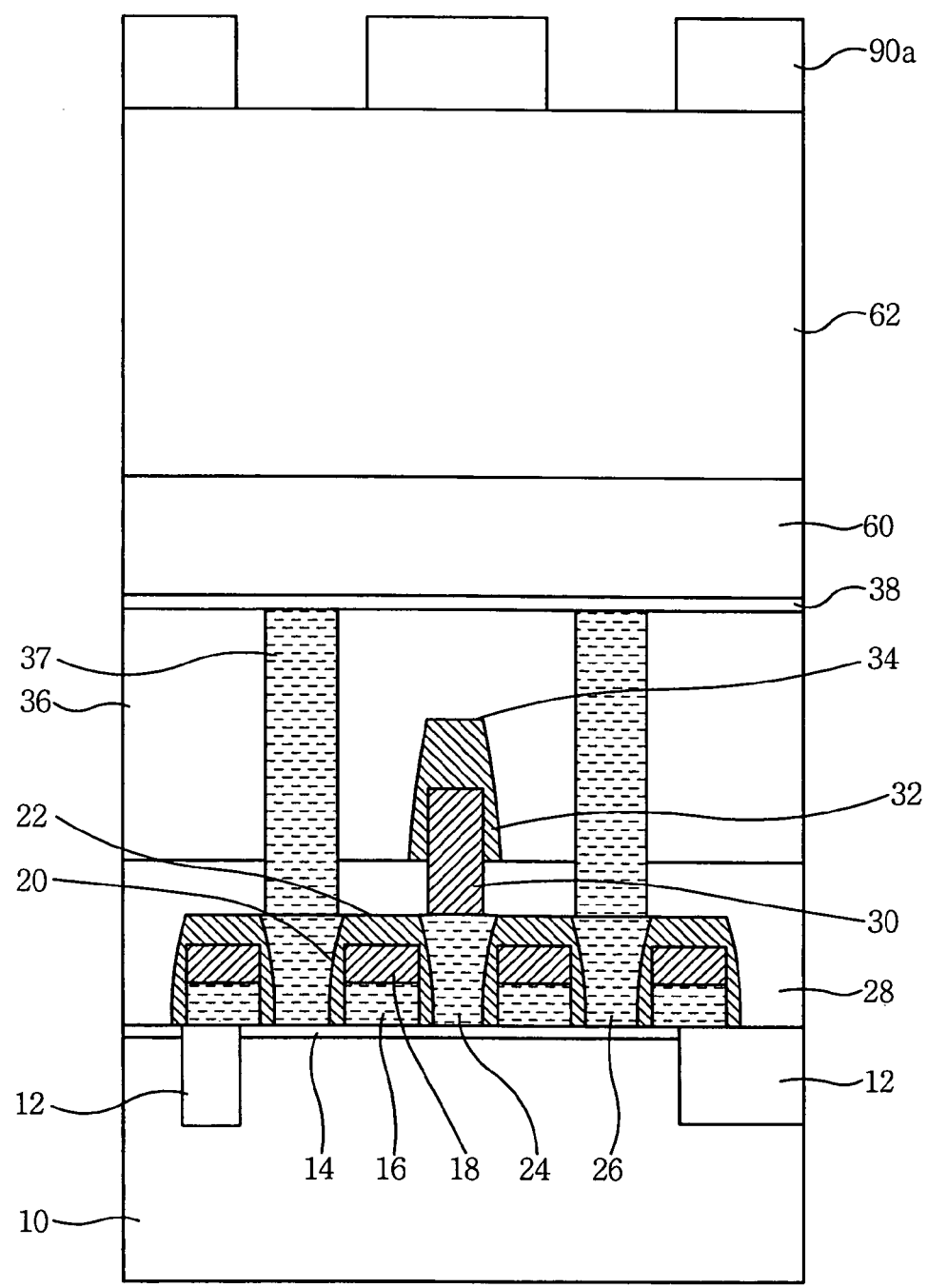

Referring to FIG. 3B, hard mask layer 90 is anisotropically etched using photoresist pattern 92 as an etching mask to form a hard mask pattern 90a. Photoresist pattern 92 is completely removed by an ashing process and a stripping process after hard mask pattern 90a is formed.

Figure 3C:
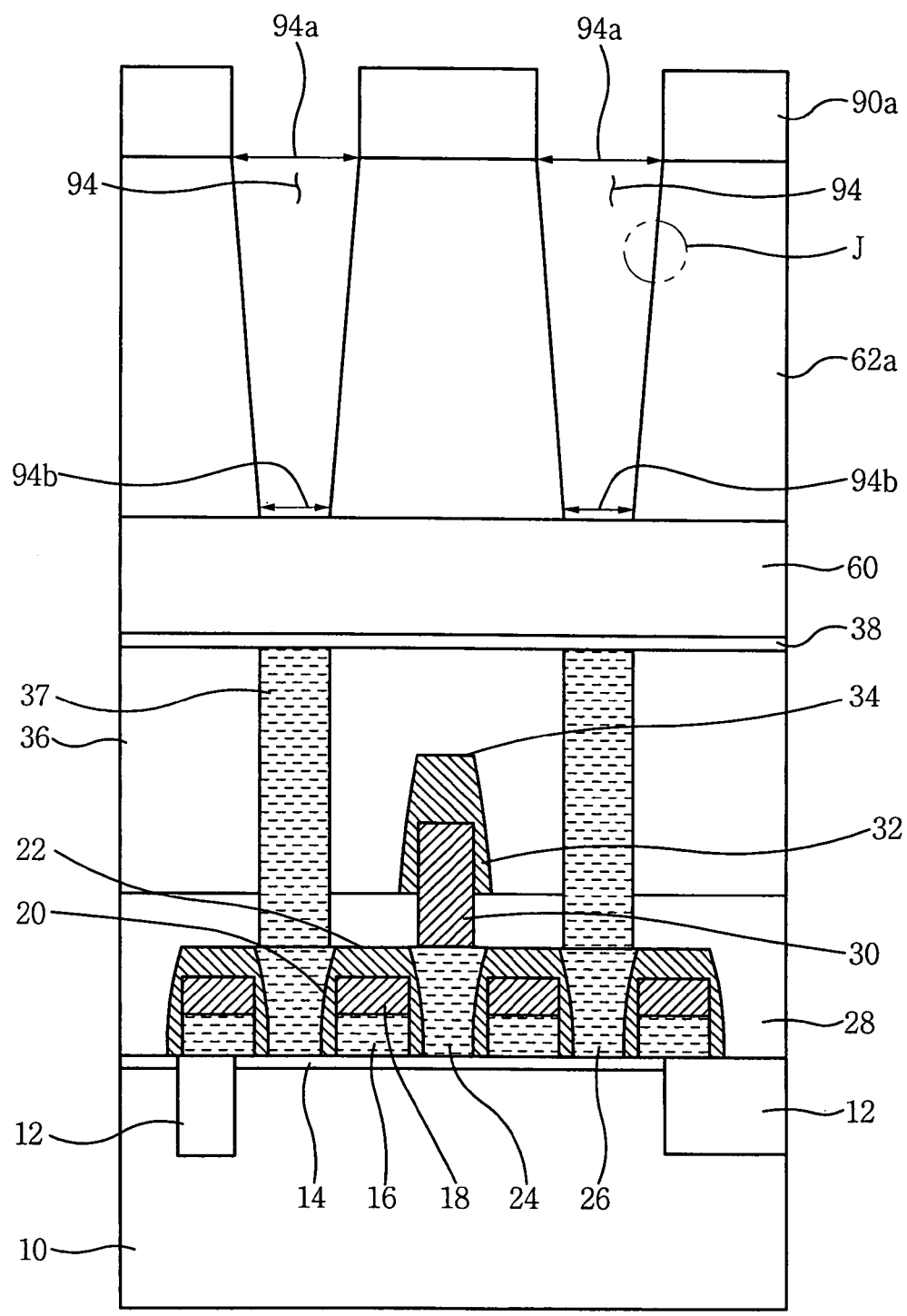

Referring to FIG. 3C, a first anisotropic etching process is performed on oxide layer 62 using hard mask pattern 90a as an etching mask, to partially remove oxide layer 62, thereby forming etched oxide layer 62a. A first opening 94 is formed in etched oxide layer 62a, thereby partially exposing a top surface of silicon germanium layer 60. A sidewall "J" of first opening 94 is somewhat inclined in etched oxide layer 62a, such that a size of first opening 94 is reduced in a vertical direction down etched oxide layer 62a. An upper portion 94a of first opening 94 is wider than a lower portion 94b of first opening 94.

Figure 3D:
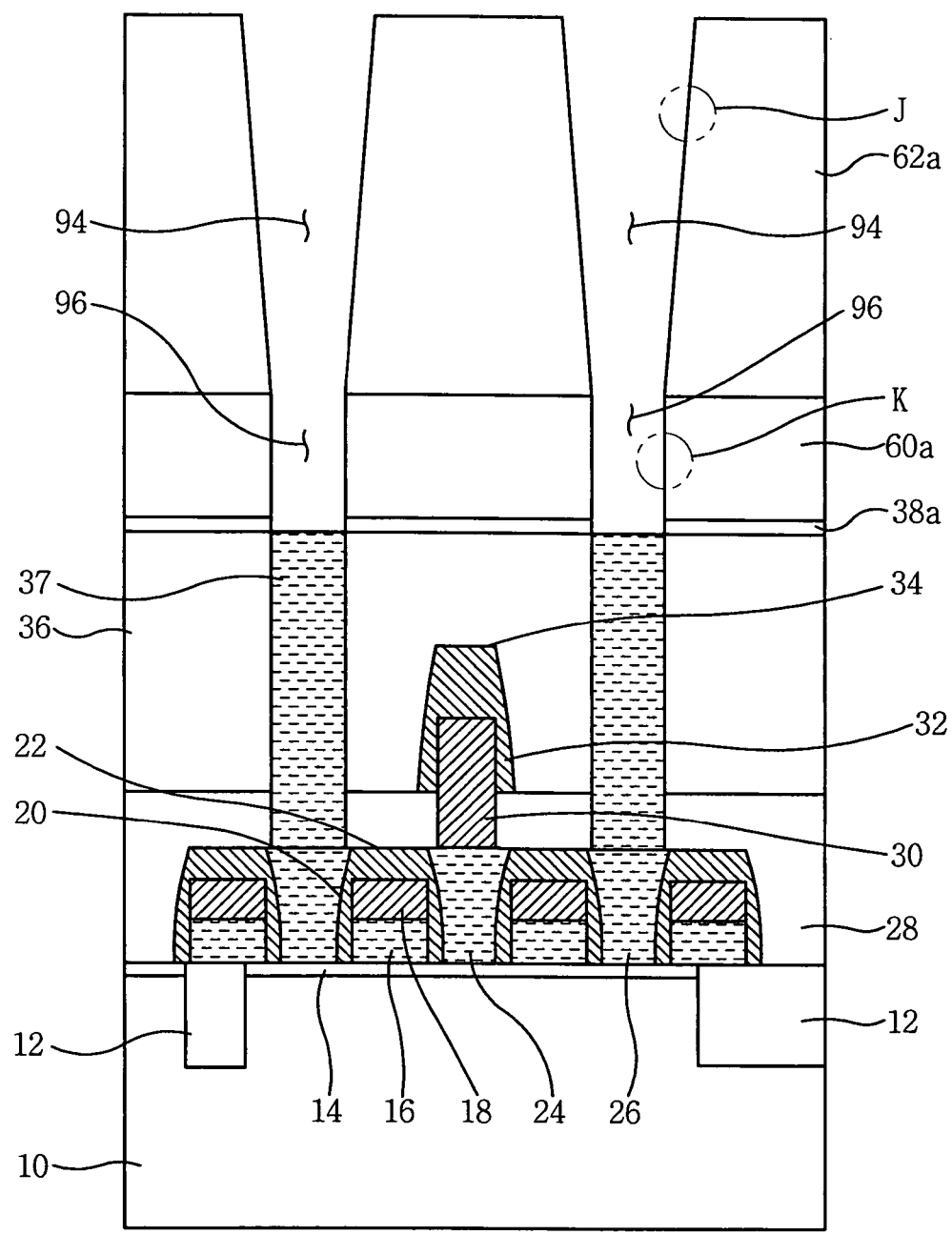

Referring to FIG. 3D, a second anisotropic etching process is performed on silicon germanium layer 60 through first opening 94 to form a second opening 96 through which a top surface of contact plug 37 is exposed. An etched silicon germanium layer 60a is formed as a result of the second anisotropic etching process and a sidewall "K" of second opening 96 is perpendicular to the top surface of the contact plug.

Etch stop layer 38 is also partially etched away during the second anisotropic etching process, thereby forming an etch stop pattern 38a. Accordingly, the top surface of contact plug 37 is exposed through first and second openings 94 and 96 and etch stop pattern 38a.

Processing conditions for the second anisotropic etching process are such that hard mask pattern 90a is removed simultaneously with silicon germanium layer 60 regardless of the size of hard mask pattern 90a. Because hard mask pattern 90a is removed simultaneously with silicon germanium layer 60, a SEM inspection process for first and second openings 94 and 96 is unobstructed.

First and second openings 94 and 96 are inspected with a SEM in order to detect any processing failures such as a "not-open" failure. In conventional methods for forming a capacitor, an additional process is required to remove the hard mask pattern for the inspection process. In contrast, hard mask pattern 90a of the present invention is removed simultaneously with etched silicon germanium layer 60a during the second anisotropic etching process, thereby eliminating the need for the additional process.

Figure 3E:
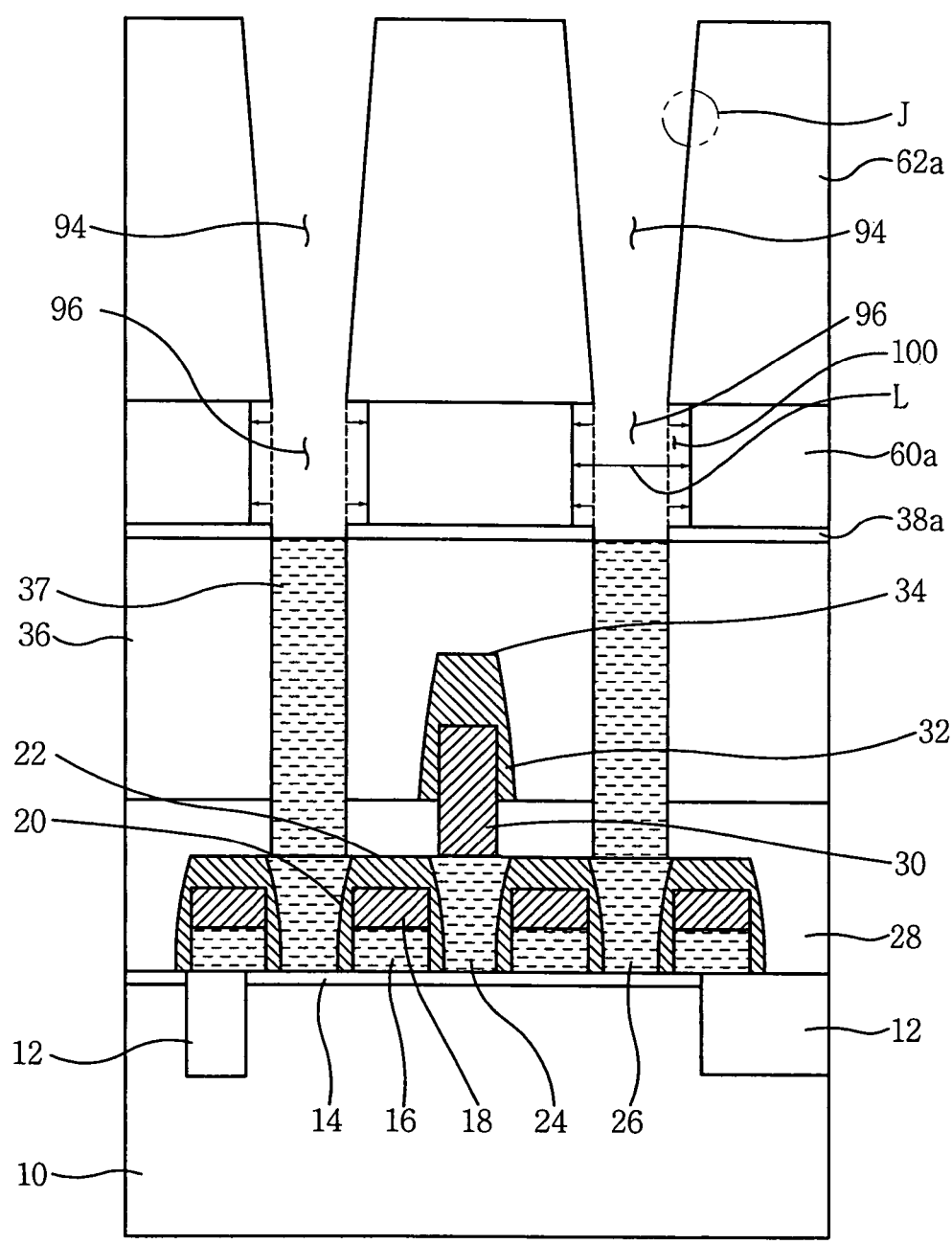

Referring to FIG. 3E, an isotropic etching process is performed on etched silicon germanium layer 60a exposed in second opening 96 to form recesses 100 in sidewalls of silicon germanium layer 60a in second opening 96. As a result, a width of second opening 96 is greater than a size of first opening 94.

According to selected embodiments of the invention, the isotropic etching process is performed using SC1 as an etchant. Etched silicon germanium layer 60a typically has an etch selectivity of about 250:1 relative to etched oxide layer 62a when using SC1. Therefore, etched oxide layer 62a is not further etched during the isotropic etching process and etched silicon germanium layer 60a is isotropically etched in a horizontal direction substantially parallel with the top surface of contact plug 37 during the isotropic etching process. Accordingly, recesses 100 are formed under etched oxide layer 62a in sidewalls of second opening 96. Therefore, a size of second opening 96 is expanded to form recesses 100. In other words, a size of second opening 96 is greater than a size of first opening 94. The size of second opening 96 is altered in accordance with etching conditions. A diameter "L" of second opening 96 is determined by an amount of etched silicon germanium layer 60a which is isotropically etched.

Figure 3F:
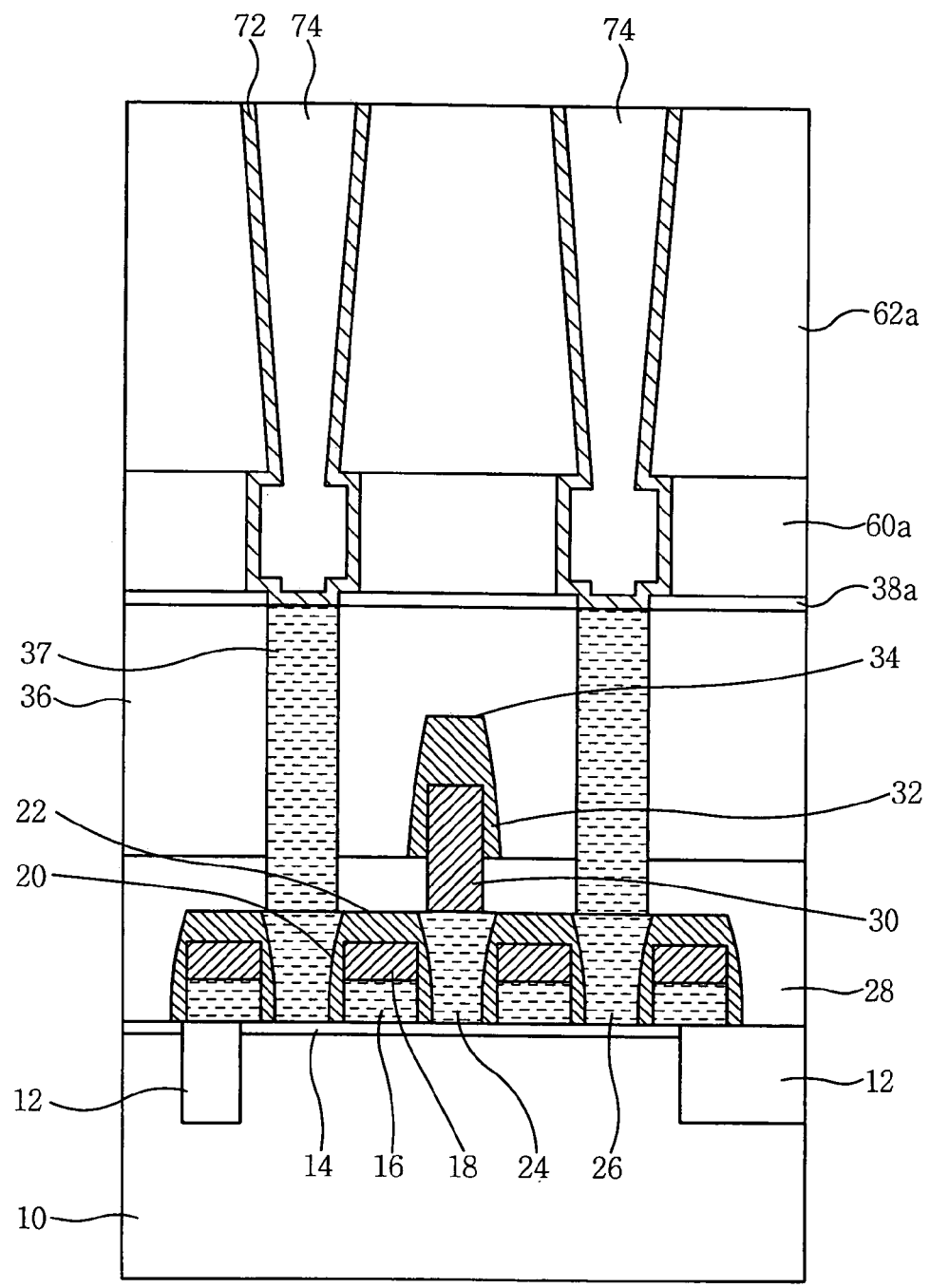

Referring to FIG. 3F, a polysilicon layer (not shown) is formed to a uniform thickness uniformly formed on inner surfaces of first and second openings 94 and 96 and on a top surface of etched oxide layer 62a using a chemical vapor deposition (CVD) process. The polysilicon layer is formed in conformity with inner contours of first and second openings 94 and 96. The polysilicon layer is used to form a storage electrode in a subsequent process.

A sacrificial insulation layer (not shown) filling first and second openings 94 and 96 is formed on the polysilicon layer. The sacrificial insulation layer and the polysilicon layer are partially removed and planarized by an etch-back process until a top surface of etched oxide layer 62a is exposed. Therefore, only the polysilicon layer and the sacrificial insulation layer remain in first and second openings 94 and 96, thereby forming a polysilicon pattern 72 and a sacrificial insulation pattern 74. Thus, capacitor nodes are separated from each other in accordance with different transistor cells.

The conventional method of forming a capacitor requires a CMP process rather than a dry-etching process for node separation since a hard mask pattern is not removed and has various pattern sizes. In contrast, the present invention may alternatively use the dry-etching process or the CMP process for node separation since the hard mask pattern is removed during the second anisotropic etching process.

Figure 3G:
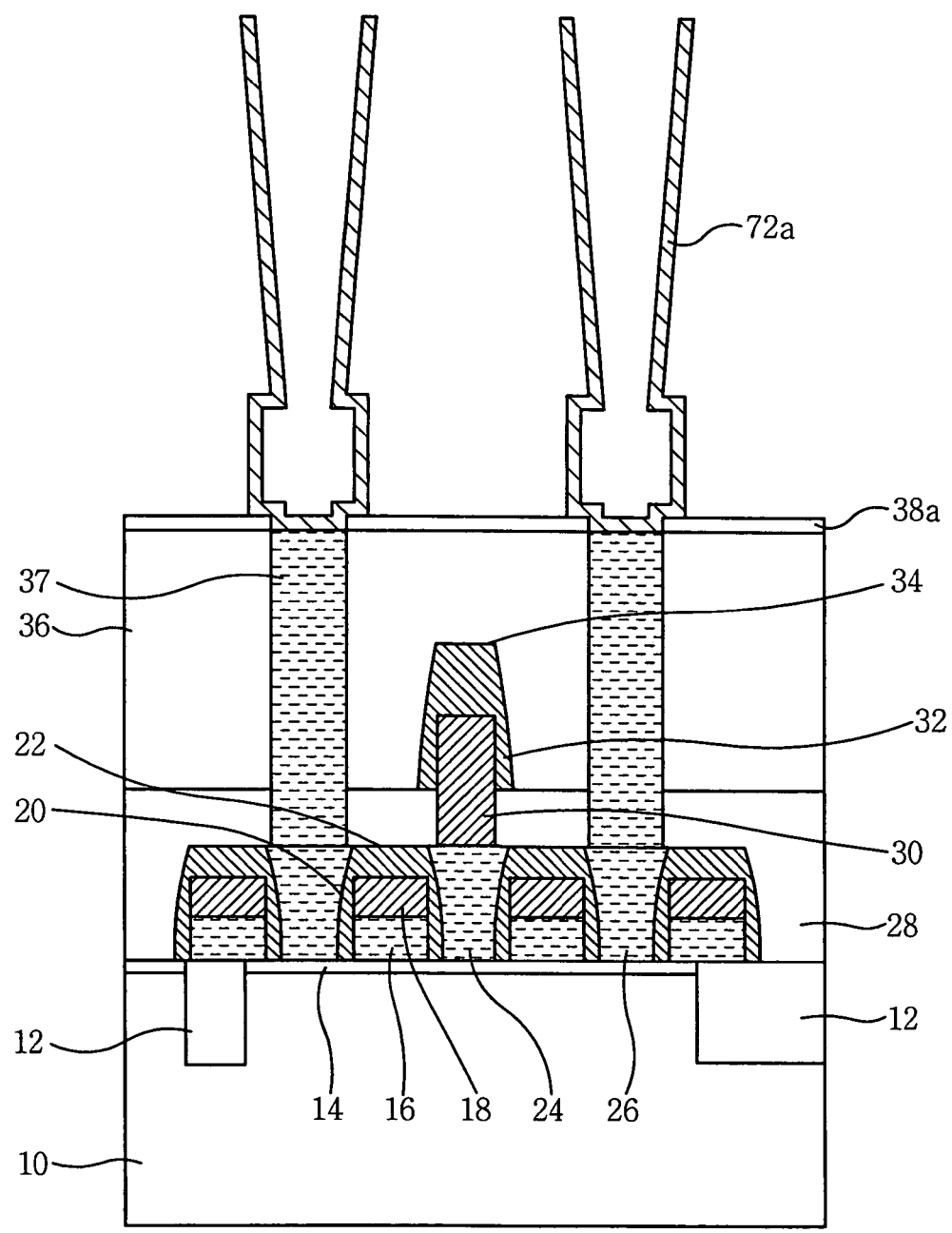

Referring to FIG. 3G, sacrificial insulation pattern 74, etched oxide layer 62a, and etched silicon germanium layer 60a are removed from etched etch stop pattern 38a, so that only polysilicon pattern 72 remains on contact plug 37. The remaining polysilicon pattern functions as a storage electrode 72a for a capacitor. In other words, storage electrode 72a is formed on contact plug 37 in conformity with inner contours of first and second openings 94 and 96.

Accordingly, storage electrode 72a is formed to have a lower portion which is wider than at least part of an upper portion thereof, thereby improving its geometric stability. Storage electrode 72a is prevented from being broken due to improved geometric stability. Hence, the reliability of the semiconductor device including the capacitor is also increased. In addition, the larger size of the lower portion of storage electrode 72a increases the effective surface of storage electrode 72a, thereby increasing the overall capacitance of the cell.

Finally, a dielectric layer (not shown) and a plate electrode (not shown) are formed to cover storage electrode 72a, thus completing a capacitor for a semiconductor device.

According to selected embodiments of the present invention, a hard mask layer is removed simultaneously with portion of a silicon germanium layer, thereby eliminating the need for an additional removal process prior to performing an inspection procedure with a SEM. As a result, the time required to manufacture a capacitor is reduced. In addition, either a dry-etching process or a CMP process may be utilized to separate capacitor nodes, thereby potentially reducing the cost of manufacturing the capacitor. Furthermore, a storage electrode is formed such that the storage electrode is prevented from being broken during an etching process used to remove a mold layer. The storage electrode is formed to have a lower portion which is wider than at least part of an upper portion thereof, thereby increasing the geometric stability of the storage electrode. The larger size of the lower portion of the storage electrode enlarges an effective surface area of the storage electrode, thereby increasing the capacitance of a device containing the storage electrode.

The exemplary embodiments of the present invention described herein are teaching examples. Those of ordinary skill will understand that various changes in form and details may be made thereto without departing from the scope of the present invention as defined by the following claims.

What is claimed:

1. A method of forming a capacitor for a semiconductor device, the method comprising:
    forming an insulation layer on a substrate surface, the substrate having a contact plug formed thereon;
    forming a silicon germanium layer on the insulation layer;
    forming an oxide layer on the silicon germanium layer;
    anisotropically etching the oxide layer and the silicon germanium layer to form an opening, the opening having an upper portion through the oxide layer and a lower portion through the silicon germanium layer, and being formed to expose the contact plug;
    isotropically etching the lower portion of the opening to form a recessed opening in the silicon germanium layer, the recessed opening having a width greater than a width associated with at least some portion of the upper portion of the opening;
    forming a storage electrode on the contact plug in conformity with sidewalls of the opening; and,
    forming a dielectric layer and a plate electrode covering the storage electrode.

2. The method of claim 1, wherein the anisotropic etching process results in the lower portion having substantially parallel sidewalls formed substantially perpendicular to the substrate surface.

3. The method of claim 1, wherein the silicon germanium layer has an etch selectivity of about 250:1 relative to the oxide layer with respect to the isotropic etching process.

4. The method of claim 1, wherein the isotropic etching process is performed using a mixture of ammonium hydroxide ($NH_4OH$), hydrogen peroxide ($H_2O_2$) and de-ionized water as an etchant.

5. The method of claim 1, wherein the silicon germanium layer is formed to a thickness ranging from about 3000 Å to 10000 Å.

6. The method of claim 1, further comprising:
    forming a polysilicon layer with a uniform thickness on sidewalls of the opening and on a top surface of the oxide layer;

forming a sacrificial insulation layer on the polysilicon layer to fill the opening;

partially removing the sacrificial insulation layer and the polysilicon layer using an etch-back process, thereby exposing a top surface of the oxide layer and forming a sacrificial insulation pattern and a polysilicon pattern in the opening;

removing the sacrificial insulation pattern and the oxide layer; and, removing the silicon germanium layer.

7. The method of claim 6, wherein the etch-back process comprises a chemical mechanical polishing (CMP) process or a dry-etching process.

8. The method of claim 6, wherein the silicon germanium layer is removed by a wet etching process using a mixture of ammonium hydroxide ($NH_4OH$), hydrogen peroxide ($H_2O_2$), and de-ionized water as an etchant.

9. The method of claim 1, further comprising:

forming an etch stop layer on the insulation layer after the insulation layer is formed.

10. A method of forming a capacitor for a semiconductor device, comprising:

forming an insulation layer on a substrate surface, the substrate having a contact plug formed thereon;

forming a silicon germanium layer on the insulation layer;

forming an oxide layer on the silicon germanium layer;

forming a hard mask layer on the oxide layer;

partially etching the hard mask layer to form a hard mask pattern;

performing a first anisotropic etching process on the oxide layer using the hard mask pattern as an etching mask, thereby forming a first opening through the oxide layer to selectively expose the silicon germanium layer;

performing a second anisotropic etching process on the selectively exposed silicon germanium layer, thereby forming a second opening through the silicon germanium layer to selective expose the contact plug;

performing an isotropic etching process on the second opening to laterally widen the second opening in the silicon germanium layer, such that the second opening is wider than at least some portion of the first opening;

forming a storage electrode on the contact plug in conformity with sidewalls of the first and second openings; and, forming a dielectric layer and a plate electrode covering the storage electrode.

11. The method of claim 10, wherein the second anisotropic etching process results in the second opening having substantially parallel sidewalls formed substantially perpendicular to the substrate surface.

12. The method of claim 10, wherein the hard mask pattern is removed from the oxide layer during the second anisotropic etching process.

13. The method of claim 10, wherein the silicon germanium layer has an etch selectivity of about 250:1 relative to the oxide layer with respect to the isotropic etching process.

14. The method of claim 10, wherein the second anisotropic etching process is performed using a mixture of ammonium hydroxide ($NH_4OH$), hydrogen peroxide ($H_2O_2$) and de-ionized water as an etchant.

15. The method of claim 10, wherein the silicon germanium layer is formed to a thickness ranging from about 3000 Å to 10000 Å.

16. The method of claim 10, further comprising:

forming a polysilicon layer with a uniform thickness on sidewalls of the first and second openings and on a top surface of the oxide layer;

forming a sacrificial insulation layer on the polysilicon layer to fill the first and second openings;

partially removing the sacrificial insulation layer and the polysilicon layer using an etch-back process, such that the polysilicon layer and the sacrificial insulation layer remain only in the first and second openings, thereby forming a polysilicon pattern and a sacrificial insulation pattern;

removing the sacrificial insulation pattern and the oxide layer; and, removing the silicon germanium layer.

17. The method of claim 16, wherein the etch-back process comprises:

a chemical mechanical polishing (CMP) process or a dry-etching process.

18. The method of claim 16, wherein the silicon germanium layer is removed by a wet etching process using a mixture of ammonium hydroxide ($NH_4OH$), hydrogen peroxide ($H_2O_2$) and de-ionized water as an etchant.

19. The method of claim 16, further comprising:

forming an etch stop layer on the insulation layer after the insulation layer is formed.

20. The method of claim 10, wherein the oxide layer comprises tetraethylorthosilicate (PETEOS).

* * * * *